(12) United States Patent
Kawabata

(10) Patent No.: US 8,952,412 B2
(45) Date of Patent: Feb. 10, 2015

(54) METHOD FOR FABRICATING A SOLID-STATE IMAGING PACKAGE

(75) Inventor: Noboru Kawabata, Kagoshima (JP)

(73) Assignee: Sony Corporation, Tokyo (JP)

( * ) Notice: Subject to any disclaimer, the term of this patent is extended or adjusted under 35 U.S.C. 154(b) by 386 days.

(21) Appl. No.: 12/555,664

(22) Filed: Sep. 8, 2009

(65) Prior Publication Data

US 2010/0009490 A1 Jan. 14, 2010

Related U.S. Application Data

(62) Division of application No. 11/567,959, filed on Dec. 7, 2006, now abandoned.

(30) Foreign Application Priority Data

Dec. 9, 2005 (JP) .................................. 2005-356354

(51) Int. Cl.
*H01L 33/00* (2010.01)
*H01L 31/0203* (2014.01)
*H01L 27/146* (2006.01)

(52) U.S. Cl.
CPC .... *H01L 27/14618* (2013.01); *H01L 27/14625* (2013.01); *H01L 27/14683* (2013.01); *H01L 27/14601* (2013.01); *H01L 2224/49175* (2013.01); *H01L 2224/73265* (2013.01); *H01L 2224/8592* (2013.01); *H01L 2224/45144* (2013.01); *H01L 2224/48227* (2013.01); *H01L 2924/3025* (2013.01)
USPC ....... 257/99; 257/433; 257/434; 257/E33.058

(58) Field of Classification Search
CPC ......... H01L 23/15; H01L 23/10; H01L 23/16; H01L 31/0203; H01L 31/048; H01L 27/14618; H01L 51/448; H01L 31/14; H01L 31/16; H01L 33/48; H01L 2933/0025; H01L 2933/0033; H01L 2933/005; H01L 31/1876; H01L 31/14625; H01L 27/146; H01L 27/14601; H01L 27/14625; H01L 2224/8592; H01L 2924/15153; H01L 27/14683; H05B 33/04
USPC ............ 438/64, 116–118, 125–127; 257/433, 257/434, 680, 687, 730, 99, E33.058
See application file for complete search history.

(56) References Cited

U.S. PATENT DOCUMENTS

| 4,982,265 A * | 1/1991 | Watanabe et al. ............. 257/737 |
| 5,721,450 A * | 2/1998 | Miles ............................ 257/667 |
| 6,759,743 B2 * | 7/2004 | Ammar ......................... 257/728 |

(Continued)

FOREIGN PATENT DOCUMENTS

| JP | 2003-133562 A | 5/2003 |
| JP | 2003-332542 A | 11/2003 |

(Continued)

*Primary Examiner* — Phat X Cao
*Assistant Examiner* — Diana C Vieira
(74) *Attorney, Agent, or Firm* — Dentons US LLP

(57) ABSTRACT

A method for manufacturing a solid-state imaging device. A solid-state image sensor is mounted on the semiconductor package support and electrically connected to first terminals and second terminals by bonding wires. The second terminals to which the bonding wires are connected are sealed with a sealing member. The optically-transparent member is thereafter disposed on the support member and the sealing member. The sealing member is cured to fix the optically transparent member.

6 Claims, 7 Drawing Sheets

(56) References Cited

U.S. PATENT DOCUMENTS

| | | | |
|---|---|---|---|
| 6,767,753 B2 * | 7/2004 | Huang | 438/25 |
| 6,798,053 B2 * | 9/2004 | Chiu | 257/684 |
| 7,298,045 B2 * | 11/2007 | Fujitani et al. | 257/724 |
| 7,419,840 B2 * | 9/2008 | Omori | 438/26 |
| 7,521,790 B2 * | 4/2009 | Tanida et al. | 257/704 |
| 7,595,540 B2 * | 9/2009 | Fukuda et al. | 257/431 |
| 2007/0120213 A1 * | 5/2007 | Hiew et al. | 257/433 |
| 2008/0099866 A1 * | 5/2008 | Chang et al. | 257/433 |

FOREIGN PATENT DOCUMENTS

| | | |
|---|---|---|
| JP | 2004-146609 A | 5/2004 |
| JP | 2005-294495 A | 10/2005 |
| JP | 2007-053335 A | 3/2007 |

\* cited by examiner

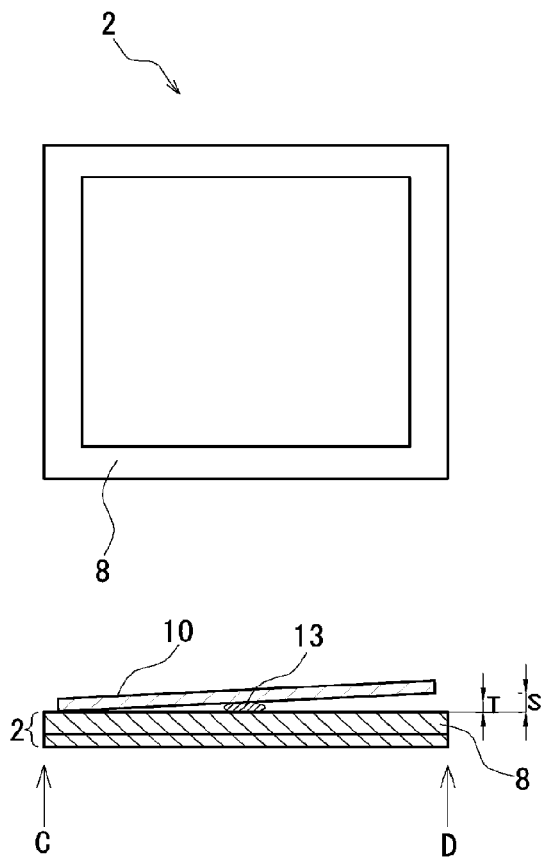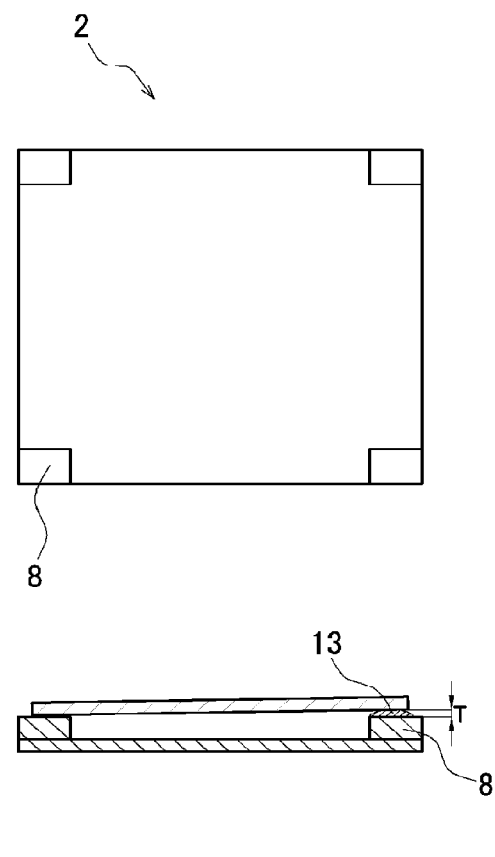

RELATED ART

RELATED ART

METHOD FOR FABRICATING A SOLID-STATE IMAGING PACKAGE

CROSS-REFERENCES TO RELATED APPLICATIONS

This application is a Divisional of U.S. patent application Ser. No. 11/567,959 filed on Dec. 7, 2006 and claims priority to Japanese Patent Application JP 2005-356354 filed in the Japanese Patent Office on Dec. 9, 2005, the entire contents both of which are incorporated herein by reference.

BACKGROUND OF THE INVENTION

1. Field of the Invention

The present invention relates to a solid-state imaging device, a fabrication method thereof, and a camera module. More particularly, the present invention relates to a solid-state imaging device using a semiconductor package support mounting a solid-state image sensor, a fabrication method and a camera module.

2. Description of Related Art

Recently, it is required for a solid-state imaging camera module using a CCD imager or a CMOS imager to be mounted, as a camera system including a signal processing unit, on a mobile terminal such as mobile phones and personal digital assistance (PDA).

A related art solid-state imaging camera module will be described with reference to the drawings. FIG. 6 is a schematic cross sectional view illustrating a related art solid-state imaging camera module. The solid-state imaging camera module 101 shown in the figure has a CCD solid-state imaging device (semiconductor package) 102 and a lens barrel 103.

The above-described CCD solid-state imaging device 102 has a CCD solid-state image sensor 106 adhered to a semiconductor package support 104 with die paste 105. First terminals 116 formed on the CCD solid-state image sensor 106 are electrically connected to second terminals 117 formed on the semiconductor package support with bonding wires 107. A step 118 is formed on the semiconductor package support. Seal glass 110 is mounted on, or disposed and fixed to, the step with sealing resin 109 there around to close an opening 108 of the semiconductor package support.

The lens barrel 103 has a lens 111 for focusing an image onto the CCD solid-state image sensor and an optical filter (not shown) for shielding an infrared light, and is fixed to the CCD solid-state imaging device with lens fixing resin 112.

Further, the CCD solid-state imaging device 102 is connected to a flexible circuit board 114 for electrically connecting the CCD solid-state image sensor and other circuits, with solder bumps 113 formed on the bottom of the semiconductor package support. Electronic components 115 are mounted on the flexible circuit board 114 to form circuits.

In order to meet requirements for compact solid-state imaging devices, a solid-state imaging device has been proposed which has a structure that seal glass is mounted on the upper surface of a semiconductor package support (refer to FIG. 7A).

In a case where a step is formed on the semiconductor package support and seal glass is mounted on the step as in the case of the structure shown in FIG. 6, the solid-state imaging device becomes larger in size than the seal glass by a region outside the step (region indicated by a symbol A in FIG. 6). In contrast, in a case in which seal glass is mounted on the upper surface of the semiconductor package support, as shown in FIG. 7A, the solid-state imaging device has generally the same size as that of the seal glass so that the solid-state imaging device can be made compact. This is a reason of proposal of the solid-state imaging device having the structure that seal glass is mounted on the upper surface of a semiconductor package support.

Demands for making solid-state imaging devices more compact are strong nowadays. In order to satisfy these demands, a solid-state imaging device has been proposed which has a structure that bonding wires are sealed with a sealing member 119 of resin material or the like and seal glass is mounted on the upper surface of the sealing member, as described in Japanese Patent Application Publication KOKAI No. 2003-332542 (refer to FIG. 7B).

In the case of the structure as shown in FIG. 7A, it is necessary to form a region for supporting the seal glass in a region outside the second terminals formed on the semiconductor package support (in the region indicated by a symbol B in FIG. 7A). In contrast, in a case of the structure that bonding wires are sealed with the sealing member and seal glass is mounted on the upper surface of the sealing member, as shown in FIG. 7B, it is not necessary to form a region for supporting the seal glass in the region outside the second terminals so that the solid-state imaging device can be made compact. This is a reason of proposal of the solid-state imaging having the structure that bonding wires are sealed with the sealing member and the seal glass is mounted on the upper surface of the sealing member.

SUMMARY OF THE INVENTION

With the above-described solid-state imaging device, it is however difficult to retain a levelness of the seal glass mounted on the upper surface of the sealing member of resin material or the like.

The solid-state imaging device whose seal glass is mounted on the upper surface of the sealing member is fabricated as in the following. Bonding wires are sealed with resin material or the like, and before the resin material is cured, the seal glass is disposed on the upper surface of the resin material, thereafter the resin material is cured to fix the seal glass. However, in this case, when the seal glass is disposed on the resin material, the resin material is still not cured so that the seal glass is disposed on the resin material in a non-cured state (in a soft state), making it difficult to retain a levelness of the seal glass.

It is possible to retain a levelness of the seal glass by curing the resin material which sealed bonding wires and thereafter disposing the seal glass on the cured resin material. However, in the case of curing the resin material and thereafter disposing the seal glass on the cured resin material, it is necessary to wait until the resin material is cured so that yield is lowered by an amount corresponding to the time taken to cure the resin material. Further, in order to fix the seal glass disposed on the cured resin material, it is necessary to coat sealing resin on the cured resin material, or on the seal glass, and to dispose the seal glass on the cured resin material having the sealing resin there between. An additional process and material are required due to a sealing resin coating work. It is therefore not always proper to adopt this method of curing the resin material and mounting the seal glass on the cured resin material.

The present invention has been made to address the above issue, and there is provided solid-state imaging devices capable of being made compact and realizing improvement on a levelness of seal glass, a fabrication method thereof, and a camera module using the solid-state imaging device of this type.

A solid-state imaging device according to an embodiment of the present invention includes a semiconductor package support, bonding wires, a sealing member, and an optically-transparent member. The semiconductor package support is mounting a solid-state image sensor. The bonding wires are electrically connecting first terminals formed on the solid-state image sensor and second terminals formed on the semiconductor package support. The sealing member seals at least the second terminals to which the bonding wires are connected. The optically-transparent member is made of an optically-transparent material, and is disposed above the solid-state image sensor. In the device, the optically-transparent member is supported by different support members formed on the semiconductor package support at three or more positions not on a single straight line.

Since the optically-transparent member is supported by the different support members formed on the semiconductor package support at three or more positions not on a single straight line, it is not necessary to support the optically-transparent member only by the sealing member before curing. It is therefore possible to retain a levelness of the optically-transparent member even if it is disposed before the sealing member is cured.

The "different support members formed on the semiconductor package support at three or more positions not on a single straight line" may be formed integrally with the semiconductor package support or may be the support members formed separately from the semiconductor package support and mounted on the semiconductor package support.

The reason of employing "different support members at three or more positions not on a single straight line" is as follows. A flat surface can be defined by different three or more points not disposed on the straight line. Therefore, a flat surface to be formed by the optically-transparent member can be defined by the "different support members at three or more positions not on a single straight line".

By sealing not only the second terminals but also the first terminals with the sealing member, it is possible to reduce moisture permeation into the connection regions between the terminals and bonding wires, and to suppress corrosion and improve the product quality. Further, since all the first and second terminals and bonding wires are sealed with the sealing member, it is possible to suppress corrosion of the bonding wires themselves so that a further improved product quality can be expected.

A fabrication method for a solid-state imaging device according to an embodiment of the present invention is the one for a solid-state imaging device including a semiconductor package support mounting a solid-state image sensor, bonding wires electrically connecting first terminals formed on the solid-state image sensor and second terminals formed on the semiconductor package support, a sealing member for sealing at least the second terminals to which the bonding wires are connected, and an optically-transparent member made of an optically-transparent material and disposed above the solid-state image sensor, in which the optically-transparent member is supported by different support members formed on the semiconductor package support at three or more positions not on a single straight line. The method includes steps of: mounting the solid-state image sensor on the semiconductor package support and electrically connecting the first terminals and the second terminals by the bonding wires; sealing the second terminals connected to the bonding wires with a sealing member and thereafter disposing the optically-transparent member on the support members and the sealing member; and curing the sealing member to fix the optically-transparent member.

A fabrication method for a solid-state imaging device according to an embodiment of the present invention is the one for a solid-state imaging device including a semiconductor package support mounting a solid-state image sensor, bonding wires electrically connecting first terminals formed on the solid-state image sensor and second terminals formed on the semiconductor package support, a sealing member for sealing at least the second terminals to which the bonding wires are connected, and an optically-transparent member made of an optically-transparent material and disposed above the solid-state image sensor, in which the optically-transparent member is supported by different support members formed on the semiconductor package support at three or more positions not on a single straight line. The method includes steps of: mounting the solid-state image sensor on the semiconductor package support and electrically connecting the first terminals and the second terminals by the bonding wires; disposing the optically-transparent member on the support members by using sealing material to fix the optically-transparent member and thereafter sealing the second terminals to which the bonding wires are connected with the sealing member; and curing the sealing member.

Another embodiment provides a fabrication method for a camera module. A CCD solid-state image sensor is mounted on a ceramic support. First terminals and formed on the CCD solid-state image sensor and second terminals formed on the ceramic support are electrically connected utilizing fine gold wires; coating surfaces of between 3-4 support members with a thermosetting epoxy resin; disposing a seal glass above the CCD solid-state image sensor on the between 3-4 support members coated with the thermosetting epoxy resin, wherein the 3-4 support members are not positioned on a straight line; coating the second terminals to cover the fine gold wires utilizing the thermosetting epoxy resin; and curing the thermosetting epoxy resin.

By forming the different support members formed on the semiconductor package support at three or more positions not on a single straight line, it becomes unnecessary to support the optically-transparent member only by the sealing member before curing. It is therefore possible to retain a levelness of the optically-transparent member even if it is disposed before the sealing member is cured.

BRIEF DESCRIPTION OF THE DRAWINGS

FIGS. 5A and 5B are schematic plan views and cross sectional views explaining position displacements of seal glass;

DETAILED DESCRIPTION OF THE DRAWINGS

With reference to the accompanying drawings, embodiments of the present invention will now be described to help understand the present invention.

Figure 1A:
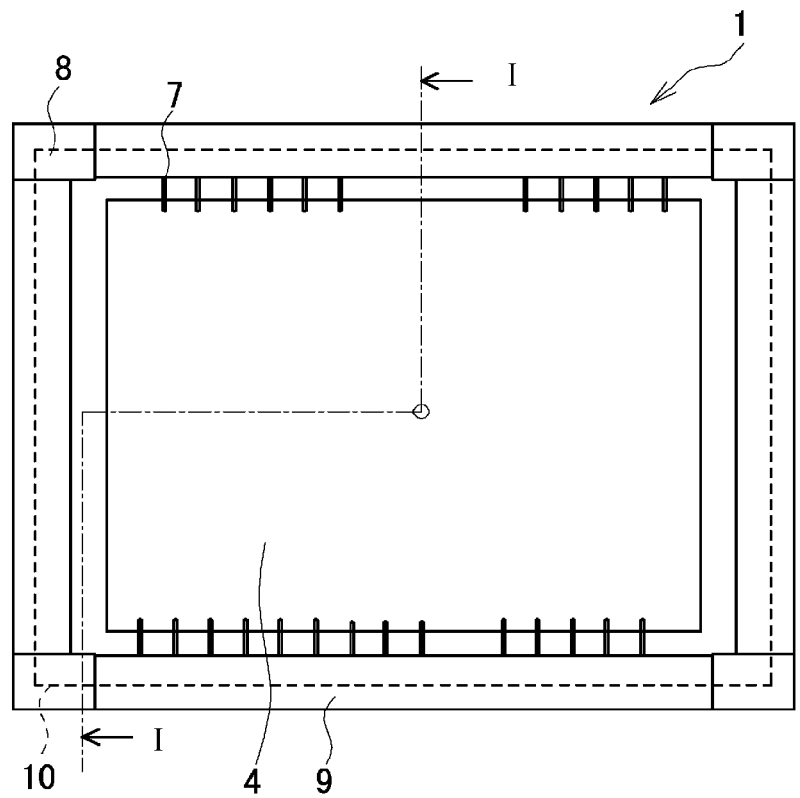
FIGS. 1A and 1B are a schematic plan view and a schematic cross sectional view illustrating a solid-state imaging device to which an embodiment of the present invention is applied.
Figure 1B:
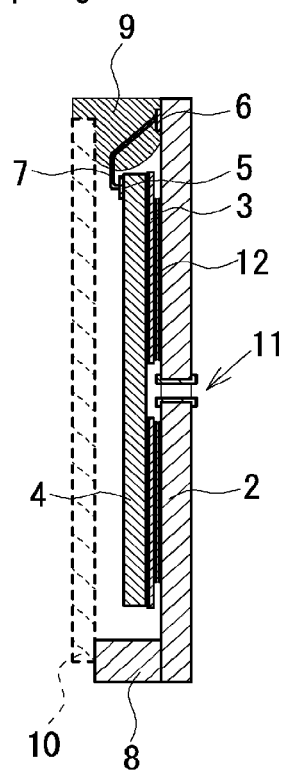
Figure 2:
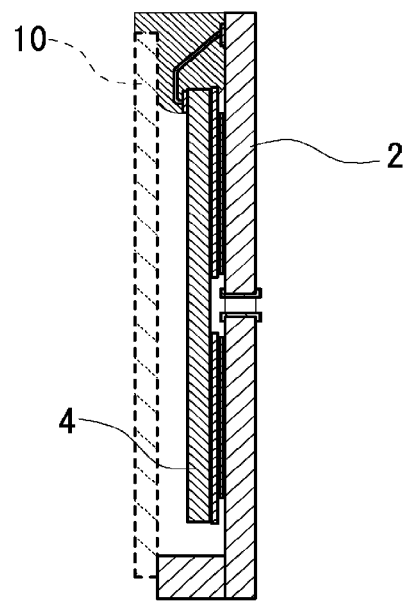
FIG. 2 is a schematic cross sectional view illustrating a modification of the solid-state imaging device to which an embodiment of the present invention is applied.

FIG. 1A is a schematic plan view of a CCD solid-state imaging device which is one of solid-state imaging devices to which an embodiment of the present invention is applied, and FIG. 1B is a schematic cross sectional view taken along symbols I-I shown in FIG. 1A.

In a CCD solid-state imaging device 1 shown in FIGS. 1A and 1B, a CCD solid-state image sensor 4 is mounted on a ceramic support 2 with die paste 3, first terminals 5 formed on the CCD solid-state image sensor are electrically connected to second terminals 6 formed on the ceramic support by fine gold wires 7. Support members 8 for supporting seal glass to be later described are formed at four corners of the ceramic support. The ceramic support is an example of a semiconductor package support, the CCD solid-state image sensor is an example of a solid-state image sensor, and the fine gold wire is an example of a bonding wire.

The second terminals and the fine gold wires connected to the second terminals are sealed with epoxy resin 9, and seal glass 10 is mounted on, or disposed and fixed to, the support members and epoxy resin. Since the epoxy resin seals the second terminals and the fine gold wires, it is necessary to select resin which does not contain chemical substances, e.g., iodine, acetic acid and the like, which may cause corrosion of the second terminals and the fine gold wires. The epoxy resin is an example of the sealing member, and the seal glass is an example of an optically-transparent member.

The solid-state imaging device 1 shown in FIGS. 1A and 1B has a hollow structure. There is therefore a fear of position displacement of the seal glass to be caused by a pressure difference between the inside and outside of the solid-state imaging device while epoxy resin is thermally cured. To avoid this, a vent hole 11 is formed through the ceramic support 2 to adopt a structure which can remove the pressure difference between the inside and outside of the solid-state imaging device 1. Furthermore, in order for a ventilation path to the vent hole 11 not to be clogged by die paste 3 coated when the CCD solid-state imaging device is mounted on the ceramic support 2, an alumina coat 12 is formed on the surface of the ceramic support 2 to secure the ventilation path.

In this embodiment, the second terminals 6 and the fine gold wires 7 connected to the second terminals 6 are sealed with the epoxy resin, i.e., the second terminals 6 and portions of the fine gold wires are sealed with the epoxy resin 9. Instead, all the first terminals 5, the second terminals 6 and the fine gold wires 7 may be sealed with the epoxy resin 9.

In the following, description will be made on a fabrication method for the CCD solid-state imaging device constructed as above. Namely, description will be made on a solid-state imaging device fabrication method to which an embodiment of the present invention is applied.

Figure 3A:
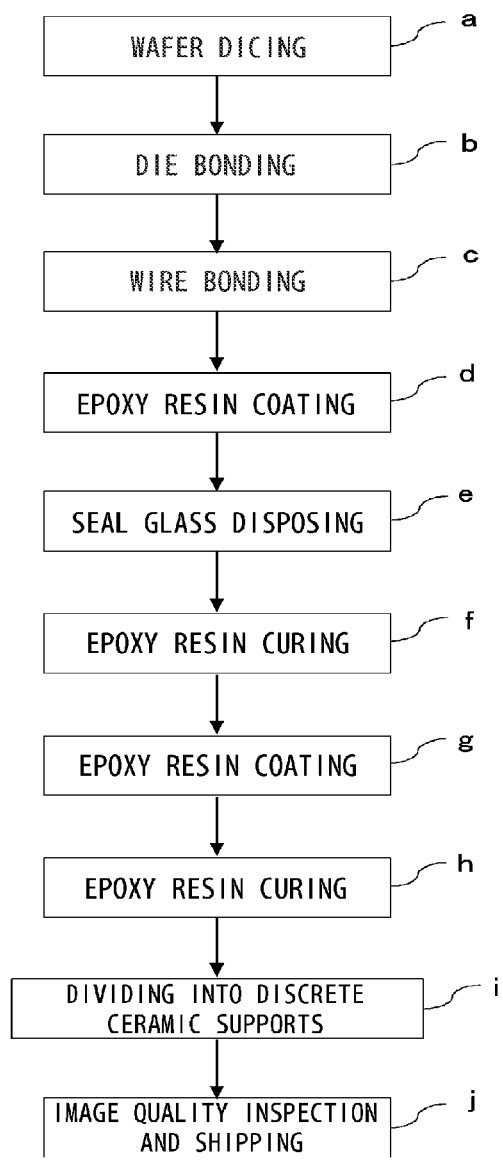
FIGS. 3A and 3B are flow charts illustrating solid-state imaging device fabrication methods to which an embodiment of the present invention is applied.

First Fabrication Method (Refer to FIG. 3A)

In an example of a solid-state imaging device fabrication method to which an embodiment of the present invention is applied, first, CCD solid-state image sensors formed on a wafer are subjected to a dicing process (wafer dicing) to separate them into discrete CCD solid-state image sensors (refer to a symbol a in FIG. 3A). Discrete CCD solid-state image sensors are die-bonded to a ceramic substrate 20 (a collective body of ceramic supports, refer to FIG. 4) formed with a plurality of ceramic supports 2 in predetermined areas of respective ceramic supports 2 (refer to a symbol b in FIG. 3A).

Next, a wire bonding process is performed for electrically connecting first terminals 5 formed on each CCD solid-state image sensor and second terminals 6 formed on each ceramic support 2 by fine gold wires 7 (refer to a symbol c in FIG. 3A). Thereafter, thermosetting epoxy resin 9 is coated to cover the second terminals 6 and the fine gold wires 7 connected to the second terminals 6 (refer to a symbol d in FIG. 3A).

Next, seal glass 10 is disposed on support members (refer to a symbol e in FIG. 3A), and a heating process is executed to cure the epoxy resin 9 coated covering the second terminals 6 and the fine gold wires 7 connected to the second terminals 6, and fix the seal glass 10 (refer to a symbol f in FIG. 3A).

Next, the thermosetting epoxy resin 9 is coated on a side end region of the seal glass (refer to a symbol g in FIG. 3A), and a heating process is executed to cure the epoxy resin 9 coated in the side end region of the seal glass (refer to a symbol h in FIG. 3A).

Coating thermosetting epoxy resin on the side end region of the seal glass and curing the resin is performed to improve air tightness of the solid-state imaging device. If sufficient air tightness can be obtained without coating epoxy resin on the side end region of the seal glass, it is not necessary to coat epoxy resin on the side end region of the seal glass.

Figure 4:
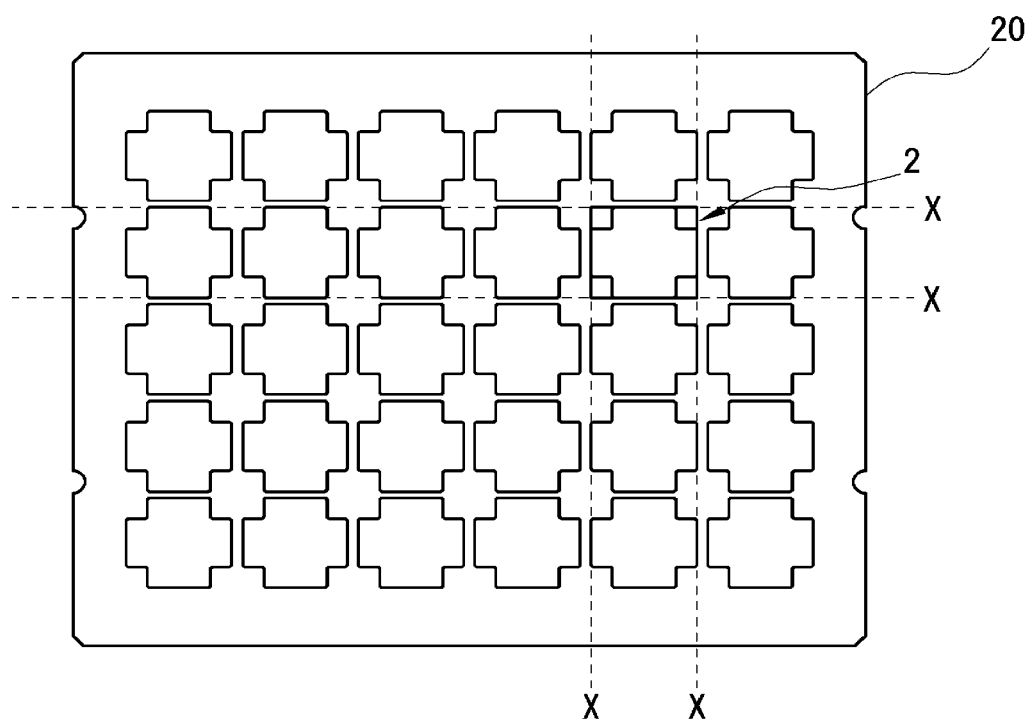
FIG. 4 is a schematic diagram showing a ceramic substrate.
Figure 6:
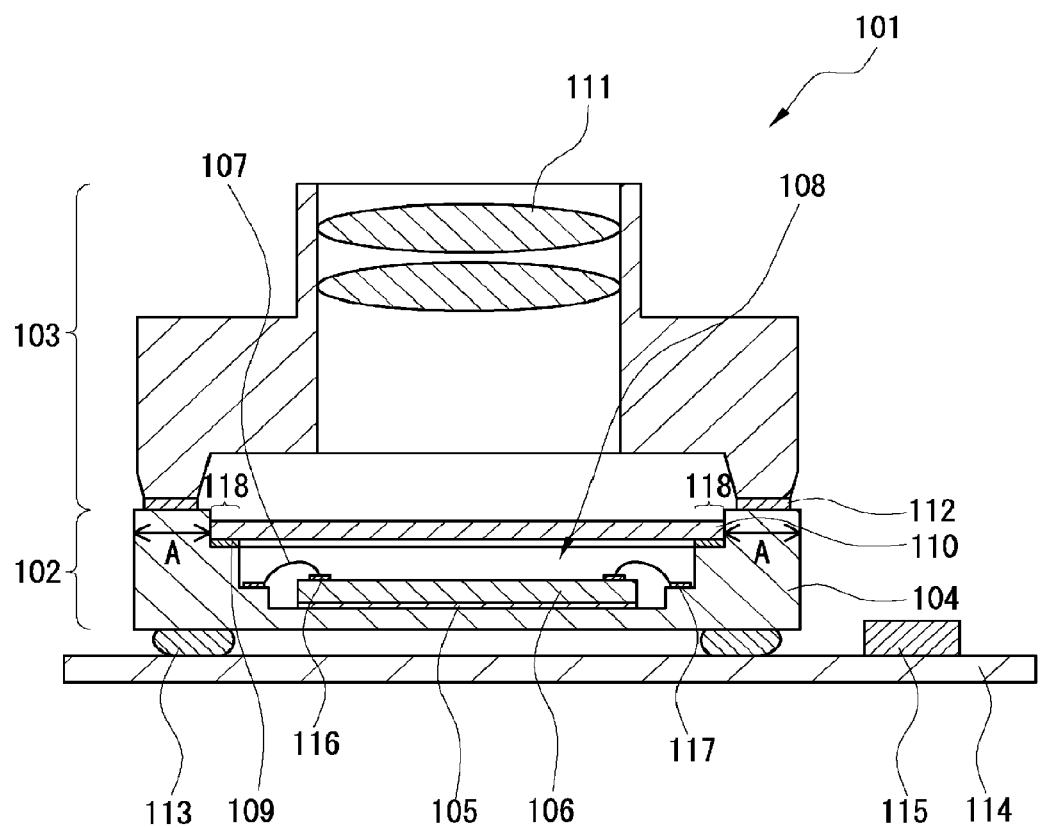
FIG. 6 is a schematic cross sectional view showing a related art solid-state imaging camera module.
Figure 7A:
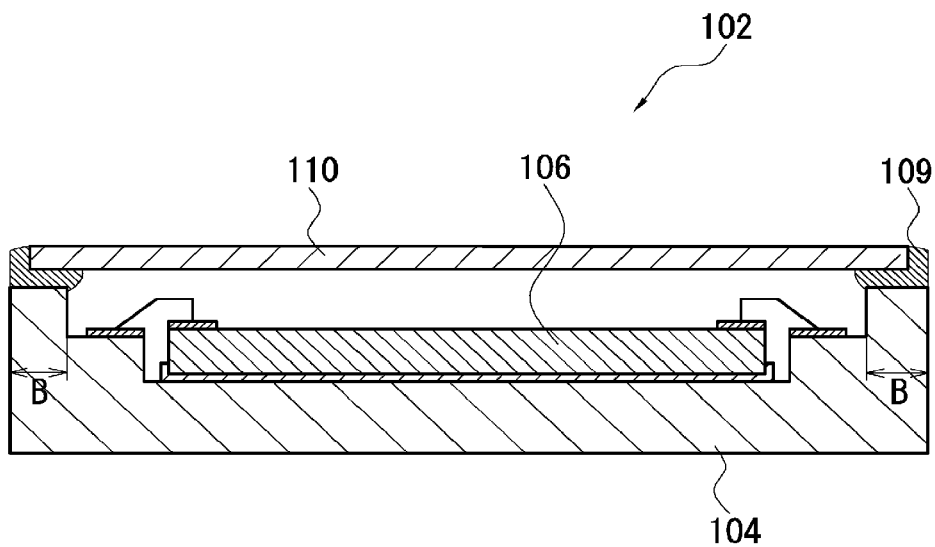
FIGS. 7A and 7B are schematic cross sectional views showing related art solid-state imaging devices.
Figure 7B:
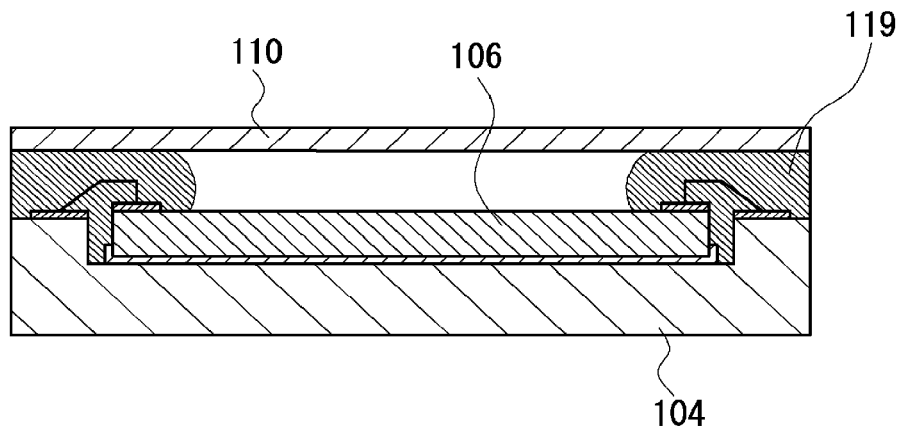

By dicing the ceramic substrate 20 along a dicing line indicated by a symbol X in FIG. 4, the ceramic substrate can be separated into discrete ceramic supports to obtain each solid-state imaging device (refer to a symbol i in FIG. 3A). The solid-state image sensors obtained in this manner are shipped after image quality inspection (refer to a symbol j in FIG. 3A).

Figure 3B:
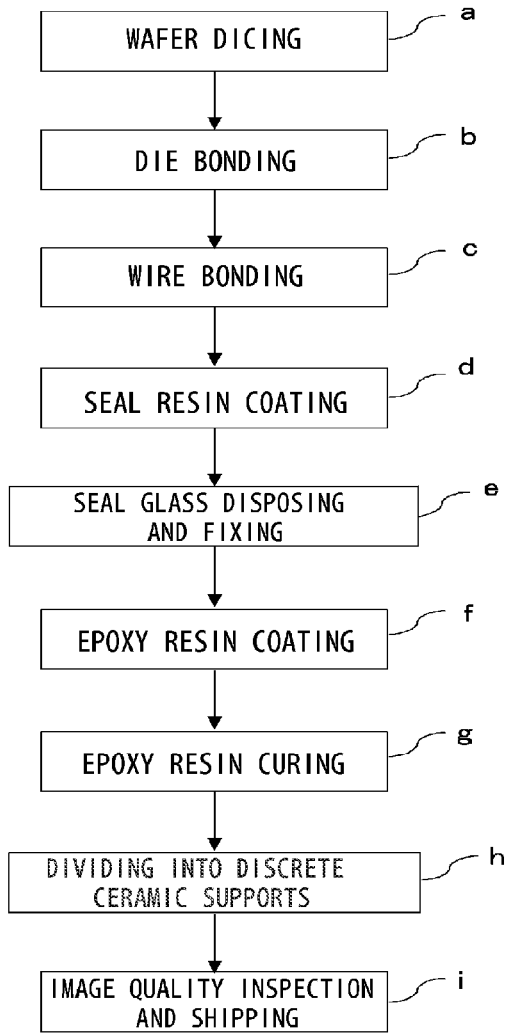

Second Fabrication Method (Refer to FIG. 3B)

In an example of a solid-state imaging device fabrication method to which an embodiment of the present invention is applied, similar to the first fabrication method described above, first, CCD solid-state image sensors formed on a wafer are subjected to a dicing process (wafer dicing) to separate them into discrete CCD solid-state image sensors (refer to a symbol a in FIG. 3B). Discrete CCD solid-state image sensors are die-bonded to a ceramic substrate 20 formed with a plurality of ceramic supports 2 in predetermined areas of respective ceramic supports (refer to a symbol b in FIG. 3B).

Next, a wire bonding process is performed for electrically connecting first terminals 5 formed on each CCD solid-state image sensor 4 and second terminals 6 formed on each ceramic support by fine gold wires 7 (refer to a symbol c in FIG. 3B).

Next, sealing resin (not shown in FIGS. 1A and 1B) is coated on surfaces of support members (refer to a symbol d in FIG. 3B) and seal glass 10 is disposed and fixed with the sealing resin (refer to a symbol e in FIG. 3B). In the first fabrication method described above, the seal glass 10 is disposed on the support members without coating sealing resin so that the seal glass 10 is not fixed until resin material is cured. With the second fabrication method, however, since the seal glass 10 is disposed on the support members in the state that the sealing resin is coated on the surfaces of the support members, the seal glass 10 is fixed to the support members.

Further, a thermosetting epoxy resin 9 is coated to cover the second terminals 6 and the fine gold wires 7 connected to the second terminals 6, and the thermosetting epoxy resin 9 is coated on the side end region of the seal glass 10 (refer to a symbol f in FIG. 3B), and thereafter a heating process is executed to cure the epoxy resin 9 coated to cover the second terminals 6 and the fine gold wires 7 connected to the second terminals 6, and the epoxy resin 9 coated on the side end region of the seal glass 10 (refer to a symbol g in FIG. 3B).

Similar to the first embodiment described above, coating thermosetting epoxy resin on the side end region of the seal glass and curing the resin is performed to improve air tightness of the solid-state imaging device. If sufficient air tightness can be obtained without coating epoxy resin on the side end region of the seal glass, it is not necessary to coat the epoxy resin on the side end region of the seal glass.

By dicing the ceramic substrate thereafter, the ceramic substrate can be separated into discrete ceramic supports to obtain each solid-state imaging device (refer to a symbol h in FIG. 3B). The solid-state imaging devices obtained in this manner are shipped after image quality inspection (refer to a symbol i in FIG. 3B).

In the solid imaging device to which an embodiment of the present invention is applied, since the seal glass is supported by the support members formed on the ceramic support, a levelness of the seal glass mounted on the epoxy resin can be retained.

In short, even if the seal glass is disposed on epoxy resin in a non-cured state, a levelness of the seal glass can be retained because the support members support the seal glass.

Specifically, in the first fabrication method for the solid-state imaging device, thermosetting epoxy resin is coated to cover the second terminals and the fine gold wires connected to the second terminals (refer to the symbol d in FIG. 3A), the seal glass is disposed on the epoxy resin (refer to the symbol e in FIG. 3A) and the epoxy resin is thermally cured to fix the seal glass (refer to the symbol f in FIG. 3A). If the support members are not provided, it is necessary to support the seal glass disposed on the epoxy resin with the epoxy resin in the non-cured state. There is therefore a possibility that the levelness of the seal glass may be lowered because the seal glass is disposed on the epoxy resin in the non-cured state. In contract, according to the embodiment in which the support members are formed on the ceramic support, since the seal glass disposed on the epoxy resin is supported by the support members, the levelness of the seal glass can be retained by the support members even if the epoxy resin is in the non-cured state.

In the solid-state imaging device to which an embodiment of the present invention is applied, since the seal glass is supported at four corners, the levelness of the seal glass can be retained more than the seal glass is supported at four sides. This point will be explained with reference to FIGS. 5A and 5B.

In a case as in a related art solid-state imaging device having a structure that the seal glass is supported at four sides, if an unintended projection 13 exists on a support surface of the seal glass caused by deformation or the like, a position displacement occurs more than a height of the projection occurs at one side (a side on a symbol D side in FIG. 5A) of the seal glass as the ceramic support supports an opposite side (a side on a symbol C side in FIG. 5A). Specifically, there occurs a position displacement (a position displacement indicated by a symbol S in FIG. 5A) higher than a height of the projection (a height indicated by a symbol T in FIG. 5A).

In contrast, in the solid-state imaging device of the embodiment in which the four corners of the seal glass are supported, even if an unintended projection exists on the support surface of the seal glass caused by deformation or the like, the extent of a position displacement of the seal glass caused by the projection can be suppressed not to exceed the height of the projection (a height indicated by a symbol T in FIG. 5B) (refer to FIG. 5B). Supporting the four corners of the seal glass makes it possible to retain the levelness of the seal glass more than the solid-state imaging device supporting the four sides as described above.

In the solid-state imaging device according to the embodiment of the present invention, since the vent hole is formed in the ceramic support, it is possible to suppress a position displacement to be caused by a temperature/pressure difference in the sealed space while epoxy resin is thermally cured.

As described above, since the solid-state imaging device according to the embodiment of the present invention can retain the levelness and suppress a position displacement of the seal glass, it is expected that an optical influence to be caused by the surface shape of the solid-state imaging device can be suppressed.

According to the solid-state imaging device fabrication method (first fabrication method) of the embodiment of the present invention, the seal glass is fixed on the epoxy resin by utilizing an adhesion force of the epoxy resin to be used for sealing, without using seal resin for fixing the seal glass to the support members. It is therefore possible to perform fixing the seal glass and sealing with the epoxy resin by using a single resin material.

According to the solid-state imaging device fabrication method (second fabrication method) of the embodiment of the present invention, the seal glass is fixed to the support member by using sealing resin, and thereafter filling epoxy resin in the space between the ceramic support and seal glass for sealing. Since the epoxy resin is filled (coated) after the seal glass is fixed, the seal glass can be mounted at a high precision.

With the solid-state imaging device, the fabrication method thereof and the camera module of the embodiments of the present invention described above, it becomes possible to make the size of the device compact and improve a levelness of the optically-transparent member.

It should be understood by those skilled in the art that various modifications, combinations, sub-combinations and alterations may occur depending on design requirements and other factors insofar as they are within the scope of the appended claims or the equivalents thereof.

What is claimed:

1. A method for fabricating a solid-state imaging device including
   (a) a semiconductor package support mounting a solid-state image sensor;
   (b) bonding wires electrically connecting first terminals on the solid-state image sensor and second terminals on the semiconductor package support;
   (c) a sealing member sealing at least the second terminals to which the bonding wires are connected; and
   (d) an optically-transparent member made of an optically-transparent material disposed above the solid-state image sensor, the optically-transparent member being supported by support members formed on the semiconductor package support at three or more positions not on a single straight line, the method comprising:
   (1) mounting the solid-state image sensor on the semiconductor package support and electrically connecting the first terminals and the second terminals by means of the bonding wires;
   (2) sealing the first and second terminals to which the bonding wires are connected with the sealing member;
   (3) after said sealing of the first and second terminals, disposing the optically-transparent member on the support members and the sealing member;
   (4) curing the sealing member to fix the optically-transparent member relative to the semiconductor package support; and
   (5) dicing the semiconductor package support along the support members to form a discrete solid-state imaging device with a discrete support member at each corner thereof.

2. A method for fabricating a solid-state imaging device including (a) a semiconductor package support mounting a solid-state image sensor;
(b) bonding wires electrically connecting first terminals on the solid-state image sensor and second terminals on the semiconductor package support;
(c) a sealing member for sealing at least the second terminals to which the bonding wires are connected; and
(d) an optically-transparent member made of an optically-transparent material and disposed above the solid-state image sensor, the optically-transparent member being supported by support members formed on the semiconductor package support at three or more positions not on a single straight line, the method comprising:
(1) mounting the solid-state image sensor on the semiconductor package support and electrically connecting the first terminals and the second terminals by means of the bonding wires;
(2) coating surfaces of the support members with a sealing material;
(3) disposing the optically-transparent member on the support members by using the sealing material between the top surfaces of the support members and the optically-transparent member to fix the optically-transparent member relative to the support members;
(4) sealing the second terminals to which the bonding wires are connected with the sealing member;
(5) curing the sealing material; and
(6) dicing the semiconductor package support along the support members to form a discrete solid-state imaging device with a discrete support member at each corner thereof.

3. The method of claim 1, wherein the semiconductor package support includes a vent hole, the vent hole being effective to remove a pressure difference between an inner and outer side of the solid-state imaging device when the sealing member is cured.

4. The method of claim 1, further comprising:
after said sealing member is cured, coating thermosetting epoxy resin on a side end region of the optically-transparent member and curing the thermosetting epoxy resin on the side end region.

5. The method of claim 1, further comprising:
applying an alumina coat and a die paste between the semiconductor package support and the solid-state image sensor to secure the solid-state image sensor to the semiconductor package support.

6. The method of claim 1, wherein:
the support members are formed integrally with the semiconductor package support, and the semiconductor package support is ceramic.

* * * * *